Sept. 20, 1966 N. H. REEVE 3,274,508
POWER AMPLIFIER INCLUDING BIASING MEANS FOR REDUCING STANDBY POWER DISSIPATION
Filed Oct. 14, 1963
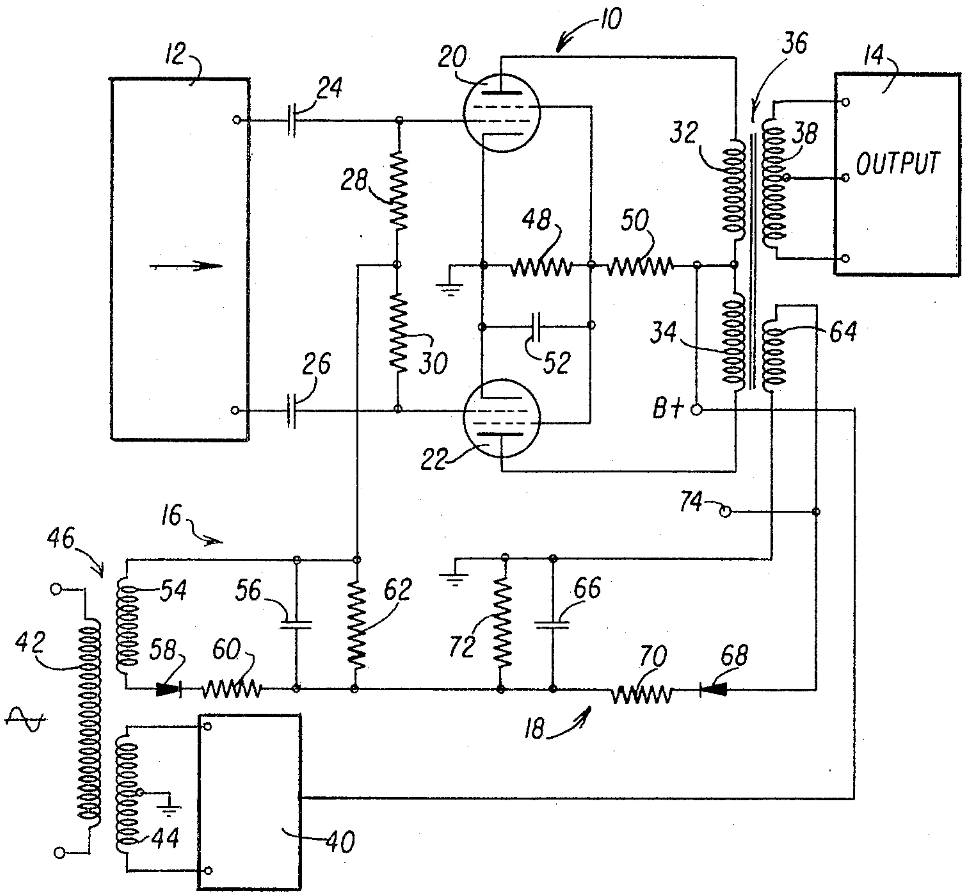
INVENTOR.
Norman H. Reeve
BY
Mason, Kolehmainen Rathburn & Wyss.
Attys.

United States Patent Office 3,274,508
Patented Sept. 20, 1966

3,274,508

POWER AMPLIFIER INCLUDING BIASING MEANS FOR REDUCING STANDBY POWER DISSIPATION

Norman H. Reeve, Racine, Wis., assignor to Webster Electric Company, Racine, Wis., a corporation of Wisconsin Filed Oct. 14, 1963, Ser. No. 315,859
4 Claims. (Cl. 330—96)

This invention relates to an amplifier and, more particularly, to an amplifier having relatively infrequent periods of use including new and improved means for reducing standby power dissipation in the amplifier.

Amplifiers used, for instance, in communication systems frequently are used only during brief random periods of the day but must be maintained in an energized or operative condition throughout the day to provide immediately available service. A number of these amplifiers use beam power tubes commonly supplied with a fixed bias for class AB operation. These tubes have the characteristic that the plate dissipation under no-signal conditions is substantially greater than the plate dissipation presented under full load conditions. With the protracted periods of non-use to which these amplifiers are subjected, the heat resulting from the no-signal plate dissipation becomes a serious problem as well as a limiting amplifier design factor. As an example, the heating of the tubes in the no-signal condition and the resultant heating of the adjacent components of the amplifier reduces tube and component life and increases the need for service as well as increasing the power consumption of the circuit. This problem is complicated by the fact that the degree of fixed bias necessary to reduce plate dissipation to a reasonable value in the no-signal condition will increase the distortion to objectionable levels at high power output levels. Thus, in some applications, it is necessary to use a relay to switch the plate supply voltage in order to reduce the heating under no-signal conditions.

Accordingly, one object of the present invention is to provide a new and improved amplifier.

Another object is to provide an amplifier including new and improved means for controlling standby or no-signal plate dissipation in the tubes therein.

Another object is to provide an amplifier with fixed bias including means for reducing plate dissipation in a no-signal condition.

A further object is to provide an amplifier arrangement in which an output tube is normally biased to a state presenting low plate dissipation in the absence of an input signal and in which means are provided responsive to the presence of an input signal for changing the bias in proportion to this signal to the level required to maintain low distortion throughout the amplifier's useful range.

In accordance with these and many other objects, an embodiment of the invention comprises a power amplifier coupled, for instance, to a source of audio frequency driving signals. The output of the amplifier is coupled to a signal utilization means. If the amplifier includes, for instance, a pair of beam power tubes connected in push-pull and operated in class AB, the plate dissipation of the tubes in the no-signal condition causes excessive heating and becomes a factor imposing severe limitations on the design of the amplifier in those instances in which the amplifier must be continuously maintained in an energized or operative condition even though it is used at only infrequent intervals. It is possible to reduce the plate dissipation in the no-signal condition by increasing the level of the negative bias provided by the fixed potential source used to supply the operating bias to the tube. However, this increase in the negative bias would introduce an excessive amount of distortion at high signal levels so that the amplifier cannot be used in most applications when operated with this high degree of bias.

In accordance with the present invention, the control grids, for instance, of the beam power amplifier tubes are supplied with a negative bias from a fixed potential source that is sufficiently high that the plate dissipation of these tubes in the no-signal condition is reduced to a moderate level even though the distortion would normally be excessive at high signal levels. However when an input signal is received and coupled through the amplifier to the output thereof, a rectifying network detects the presence of the amplified output signal and injects an oppositely poled biasing potential in the bias circuit for the output tubes to reduce the level of bias to the optimum point at which minimum distortion is encountered During the periods in which the amplifier is driven from the signal source, plate dissipation is allowed to rise to the required levels for normal operation. However, as soon as an input signal is no longer supplied to the amplifier, the injected voltage derived from the output of the amplifier is removed, and the fixed potential source biases the amplifier in its no-signal condition to the point at which plate dissipation is reduced to a low level.

Many other objects and advantages of the present invention will become apparent from considering the following detailed description in conjunction with the single sheet of drawings which comprises a schematic diagram of an amplifier circuit embodying the present invention.

The drawings illustrate an amplifier which is indicated generally as 10 and which embodies the present invention. The amplifier 10 is connected between a driving signal source 12, such as a source of audio frequency signals, and an output load or signal utilizing means 14. The amplifier 10 is of the type operated with an optimum fixed bias from a fixed potential source in a range in which a minimum amount of distortion is present. However, in applications in which the amplifier 10 is provided with driving signals from the source 12 at infrequent intervals, the plate dissipation in the amplifier 10 in this no-signal condition is at its maximum with the result that the operational life of the components of the amplifier is shortened.

To overcome this deficiency, a fixed potential biasing source indicated generally as 16 is provided which biases the amplifier 10 beyond its optimum operating range to a point at which the plate dissipation is substantially reduced although an excessive amount of distortion would be introduced if the amplifier 10 is operated with this bias. Thus, during the no-signal periods, the fixed biasing network 16 biases the amplifier 10 to a point at which plate dissipation is substantially reduced. However, it is necessary to restore normal bias during the periods in which the amplifier receives input signals, and a control network indicated generally as 18 is provided which is responsive to the appearance of an amplified signal at the output of the amplifier 10 and which injects a voltage in opposition to the fixed bias provided by the network 16 during these periods of operation to reduce the bias provided by the network 16 to a range in which the amplifier 10 operates normally and with a minimum distortion. During these periods in which the amplifier 10 is driven by the signal source 12, plate dissipation is not excessive because of the large proportion of the total power that is delivered to the load circuit 14.

The amplifier 10 can be of any of the well-known types and is illustrated as comprising a pair of beam power tetrode tubes 20 and 22 whose control grids or input electrodes are coupled to the driving signal source 12 by a pair of coupling capacitors 24 and 26. The driving signal source 12 provides the control grids of the tubes 20 and 22 with signals 180° out-of-phase with each other. These control grids are also connected to the fixed potential biasing network 16 through a pair of grid resistance elements 28 and 30.

The plate or output electrodes of the tubes 20 and 22 are connected to two windings 32 and 34 of a center-tapped primary winding of an output transformer 36. A center-tapped secondary winding 38 of the output transformer 36 is connected to the output or signal utilizing device 14. The common connection of the windings 32 and 34 is connected to a power supply circuit 40, such as a full-wave rectifier network, which is coupled to a suitable source of alternating current potential through a primary winding 42 and a secondary winding 44 of a power transformer 46. The screen grids of the tubes 20 and 22 are provided with an operating potential by a voltage dividing network including a pair of resistances 48 and 50 connected in series between the output of the power supply 40 and ground. A screen bypass capacitor 52 is coupled in parallel with the resistance element 48.

The control grids of the tubes 20 and 22 are provided with a fixed bias by the fixed potential source of network 16. This network includes a secondary winding 54 on the power transformer 46 connected to a filter capacitor 56 through a rectifier 58 and a series resistance element 60. The capacitor 56 is charged to a potential on the order of, for instance, 55 volts which is applied across a parallel connected resistance 62 and supplied to the common point of the grid resistance elements 28 and 30. Since the cathodes of the tubes 20 and 22 are connected directly to ground or a reference potential, these tubes are provided with a fixed bias.

In prior amplifiers 10 in which the tubes 20 and 22 were biased for class AB operation in a 56-watt amplifier, the lowest possible distortion at full amplifier output was achieved with a negative bias of around 40 volts. The plate loss for each of the tubes 20 and 22 at full output was around 24 watts, but this plate loss per tube increased to around 32 watts in the no-signal condition in which a signal is not supplied from the signal source 12. In the no-signal condition, the full 32 watts for each of the tubes 20 and 22 is dissipated substantially only as heat and presents a serious problem in the design of the amplifier 10. However, when the fixed bias is increased from around 40 volts to a negative potential of around 55 volts, the plate loss for each of the tubes 20 and 22 drops to around 15 watts, but the intermodulation distortion at full output from the amplifier 10 with the increased negative bias increases from an optimum value of around one percent to a value near ten percent. The change in distortion at low output levels increases insignificantly from around ½ of one percent at the optimum fixed bias to around one percent at the increased bias which provides the reduced plate dissipation. This greatly increased distortion when the full power output is derived from the amplifier 10 is such that even though the plate dissipation in the standby or no-signal condition is reduced, the amplifier 10 is unsatisfactory.

To permit both the reduced standby plate power dissipation and the low distortion performance of the amplifier 10 to be obtained, the control circuit 18 is provided. This network includes a secondary winding 64 on the output transformer 36 which is coupled across a filter or storage capacitor 66 through a series connected rectifier 68 and resistance element 70. The polarity of the rectifier 68 is such that a positive potential substantially equal to the difference between the optimum operating negative bias for the tubes 20 and 22 and the optimum bias for reducing plate dissipation is developed across a resistance element 72 that is connected in parallel with the capacitor 66 and in series between ground and one terminal of the resistance element 62. In the illustrative example in which minimum distortion is provided with a negative 40 volt bias, an optimum low plate dissipation is realized with a negative bias of around 55 volts. Thus, the network 18 develops a potential varying between zero and 15 volts in dependence on the magnitude of the output signal supplied to the transformer 36 by the tubes 20 and 22. The secondary winding 64 in the control means 18 is also provided with a terminal 74 that can be used to supply a negative feedback voltage to the amplifier 10.

In operation, with an absence of driving signals from the source 12 at the control grids of the tubes 20 and 22, the fixed potential biasing network 16 supplies a large negative potential through the resistance elements 28 and 30 to reduce the plate loss in these tubes to a relatively low value. When the amplifier 10 is placed in use so that signals are supplied through the coupling capacitors 24 and 26 from the driving signal source 12, the output signal developed by the tubes 20 and 22 has a relatively low level of distortion if the level of the input signals is low and has a very high distortion approaching ten percent if a high level signal is supplied by the driving signal source 12. The amplified output signal from the tubes 20 and 22 is also applied across the secondary winding 64 and is rectified by the rectifier 68 to provide a direct current potential across the capacitor 66 and the resistance element 72. This positive potential, which varies in accordance with the magnitude of the output signal, is injected in series with the fixed negative biasing potential applied across the resistance element 62 by the network 16 and serves to reduce the effective fixed bias supplied to the control grids of the tubes 20 and 22 in dependence on the presence and magnitude of the amplified signal from the amplifier 10.

The reduced negative bias now applied to the control grids of the tubes 20 and 22 permits an increase in the plate dissipation of these tubes which is not significant due to the fact that power is being delivered to the signal utilization device or output means 14. However, this reduced negative biasing potential reduces the distortion in the amplifier 10 from around ten percent to around one percent. Thus, the signal supplied by the signal source 12 is amplified by the amplifier 10 and applied to the output or load means 14 with a reasonable and acceptable amount of distortion. The time constant of the control means or circuit 18 is made as short as possible so that the negative bias provided by the fixed potential biasing network 16 is immediately reduced in response to the receipt of a signal from the signal source 12. The control circuit 18 can also use a fullwave rectifier in place of the diode 68 so that the value of the elements 66 and 70 can be reduced to afford a shorter time constant.

When the supply of signals to the amplifier 10 from the signal source 12 is terminated, the winding 64 no longer supplies signals for rectification by the diode 68, and the charge on the capacitor 66 is discharged through the parallel resistance element 72. At this time, the negative biasing potential applied to the control grids of the tubes 20 and 22 returns to the high negative value supplied by the network 16 so that the plate dissipation in the standby or no-signal condition is reduced to an acceptable level.

The drawing illustrates one embodiment of the invention in which the amplifier 10 is provided with a fixed bias by the network 16. The present invention can also be used with an amplifier having self-bias, such as one in which a parallel circuit of a resistance element and a capacitor is connected between ground and the cathodes of the output tubes. The values of the components in the self-bias circuit are so selected that the no-signal cathode bias is more negative than the optimum value, and the potential developed by the network 18 is applied to the control grids through a pair of grid resistance elements, such as the elements 28 and 30. The potential supplied by the network 18 reduces the non-linearity of the output tubes under signal input conditions.

Although the present invention has been described with reference to a single illustrative embodiment thereof, it should be understood that numerous other modifications and embodiments can be devised by those skilled in the art that will fall within the spirit and scope of the principles of this invention.

What is claimed as new and desired to be secured by Letters Patent of the United States is:

1. An amplifier for use with a signal source comprising an amplifier stage including a pair of beam power tubes in push-pull configuration and having input control elements coupled to the signal source, said amplifier stage having an output circuit, a signal utilizing means coupled to the output circuit of said amplifier stage, a fixed value potential source connected to the input control elements for applying a negative bias of about 55 volts to the amplifier stage to substantially reduce no-signal plate dissipation while introducing an appreciable amount of signal distortion when a signal is applied to the input control elements, and control means coupled to the output circuit of said amplifier stage and to said input control elements and responsive solely to the amplified signal supplied to the signal utilizing means for reducing the bias applied to the input control elements to bias the amplifier stage for normal class AB operation during the periods in which a signal is applied to the input control element, said control means including series connected rectifying and capacitive means arranged to develop a positive bias effective to reduce said negative bias to about 40 volts.

2. An amplifier for use with a signal source comprising an amplifier stage including a pair of electron control devices having input control elements and an output, means coupling said input control elements and said signal source for supplying said input control elements with input signals, an output transformer having a primary winding connected to said output, a fixed value potential source, biasing means interconnecting said potential source and said input control elements for biasing said control devices to a standby condition characterized by small current flow through said output, an additional winding electromagnetically coupled with said output transformer primary winding, a control circuit including rectifier means and capacitance means connected in series with said additional winding for storing electrical energy in accordance with signals induced in said additional winding, and means interconnecting said control circuit and said input control elements for changing the biasing of said control devices between the standby condition and an operating condition characterized by increased current flow through said output in response to input signals of increasing level.

3. An amplifier for use with a source of intermittent driving signals comprising an amplifier stage including two electron control devices in push-pull configuration each having a control electrode coupled to receive driving signals from the source, an output transformer having a primary winding in circuit with said amplifier stage for receiving amplified signals when driving signals are provided by said source, a secondary winding for providing output signals from the amplifier, fixed biasing means including an A.C. signal source, a first parallel connected resistor capacitor pair, a rectifying circuit coupled between said A.C. signal source and said first pair for developing a fixed bias potential across said first pair, resistance means coupled between one side of said first pair and each of said control electrodes for biasing said electron control devices to a standby condition characterized by low power dissipation, high distortion and low level amplification in the absence of driving signals from said source, an additional winding inductively coupled with said primary winding, a control network including a second parallel connected resistor and capacitor pair having a first side connected to the second side of said first pair and a second side connected to a point of reference potential, a diode rectifier connected in series with said additional winding and with said second pair for developing a varying control bias potential across said second pair solely in response to the presence of amplified signals at said primary winding, said rectifier being arranged so that said control bias is in opposition to said fixed bias potential thereby to shift the bias on said control devices toward a point characterized by high level amplification and low distortion as the driving signal continues.

4. An amplifier as defined in claim 3 wherein said electron control devices are beam power tubes, and wherein said fixed bias potential is about negative 55 volts, and wherein said varying control bias potential varies between 0 and positive 15 volts.

References Cited by the Examiner

UNITED STATES PATENTS

| | | | |
|---|---|---|---|
| 2,318,061 | 5/1943 | Dailey | 330—123 X |
| 2,527,406 | 10/1950 | Donker | 330—123 X |
| 2,563,773 | 8/1951 | Crownover et al. | 330—129 X |
| 2,567,272 | 9/1951 | Buys | 330—123 X |
| 2,815,407 | 12/1957 | Hafler | 330—123 X |
| 3,166,719 | 1/1965 | Wiencek | 330—22 X |
| 3,209,275 | 9/1965 | Clifton | 330—96 X |

ROY LAKE, *Primary Examiner.*

R. P. KANANEN, F. D. PARIS, *Assistant Examiners.*